United States Patent
Storino et al.

(10) Patent No.: US 6,748,556 B1
(45) Date of Patent: Jun. 8, 2004

(54) CHANGING THE THREAD CAPACITY OF A MULTITHREADED COMPUTER PROCESSOR

(75) Inventors: Salvatore N. Storino, Rochester, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 585 days.

(21) Appl. No.: 09/638,577

(22) Filed: Aug. 15, 2000

(51) Int. Cl.⁷ .................................. G06F 11/00
(52) U.S. Cl. .................... 714/42; 714/38; 714/127
(58) Field of Search ............................ 714/38, 42, 127

(56) References Cited

U.S. PATENT DOCUMENTS

| | | | | |
|---|---|---|---|---|
| 4,489,401 A | * | 12/1984 | Smarandoiu et al. | 365/200 |
| 5,659,551 A | * | 8/1997 | Huott et al. | 714/725 |
| 5,778,243 A | * | 7/1998 | Aipperspach et al. | 712/11 |
| 5,805,789 A | * | 9/1998 | Huott et al. | 714/7 |
| 5,835,705 A | * | 11/1998 | Larsen et al. | 714/47 |
| 5,953,530 A | * | 9/1999 | Rishi et al. | 717/127 |
| 6,119,145 A | * | 9/2000 | Ikeda et al. | 709/203 |
| 6,256,775 B1 | * | 7/2001 | Flynn | 717/127 |
| 6,418,542 B1 | * | 7/2002 | Yeager | 714/38 |

FOREIGN PATENT DOCUMENTS

| | | | | |
|---|---|---|---|---|
| US | PCT/US98/21716 | * | 4/1999 | G06F/9/38 |

* cited by examiner

Primary Examiner—Robert Beausoliel
Assistant Examiner—Emerson Puente
(74) Attorney, Agent, or Firm—Karuna Ojanen (57) ABSTRACT

In a multithreaded processor, a method and an apparatus to selectively disable one or more threads is disclosed. As multithreading is increasingly becoming the normative paradigm of computer architecture, there still may instances which warrant disabling a thread, such as using operating systems not coded for the specific number of threads, having defective registers/arrays peculiar to a thread, certain kinds of testing procedures. Thus a method is disclosed to test the function of each thread separately and discern if any threads have defective register/arrays. If so or for other reasons, a method and apparatus are disclosed to selectively disable access to the registers/arrays peculiar to the thread. Features of the invention allow the disablement of individual storage elements in multithreaded registers/arrays or to disable access to hardware registers or individual bits in hardware registers associated with the failed thread. Techniques can be used to route data and instructions for the disabled thread to other threads. Preferably, the tests are performed and the method to disable access to the register/arrays are accomplished before the processors are sold.

16 Claims, 7 Drawing Sheets

CHANGING THE THREAD CAPACITY OF A MULTITHREADED COMPUTER PROCESSOR

TECHNICAL FIELD

This invention relates generally to the field of hardware multithreaded computer processing and more particularly relates to a method to change the number of threads that a hardware multithreaded computer processor is capable of executing.

BACKGROUND OF THE INVENTION

A hardware multithreaded computer processor maintains the state of more than one thread in architected hardware processors within the processor core. Several threads may execute in a multithreaded processor by merely changing hardware registers each associated with a unique thread. The processor may change registers on every machine cycle or the processor may switch registers, i.e., switch threads, when the processor is idle because, for instance, it is waiting for data or instructions from a more distant cache or memory.

Recently, the processor's registers, such as the general and special purpose registers and other multithreading memory arrays, have been specialized for multithreading by eliminating read independence. The multithreaded registers/arrays have storage cells that are still arranged in a matrix but each storage cell has a number of storage elements, each associated with a unique thread of operation. Hardware multithreaded processing has surpassed performance expectations and is becoming the normative paradigm of computer architecture.

There are instances, however, when it is desirable to disable one or more threads in the processor. This can happen when a multithreaded processor is needed to function only as a single-threaded processor. An example of a time when a multithreaded processor need only function as a single-threaded processor is during a processor bring-up test which tests the processor design after manufacturing but before any processors are sold to customers. Another time that single-threaded processing is preferred is when the processor is used with operating systems that are not programmed to use the multithreading capability.

Yet another time when it is preferable to disable one or more threads of a multithreaded processor is when defects occur in the multithreaded registers/arrays resulting in a computer failure. To avoid the failure of a computer after its components have been fabricated and assembled, many manufacturers test their processors and memory components before the computers are sold to customers and eliminate the computer components having errors. One type of failure of a processor may be attributed, inter alia, to AC defects of the general and special purpose registers within the processor core and of the computer's main random access memory caused by stressing the components under normal usage. A processor's registers/arrays also may undergo LBIST and ABIST tests which test the capacity of a digital storage device to grab and hold a bit for the required time. At the present time, when a multithreaded processor fails one of these tests, it is discarded.

The failure of a processor, however, may be unique to only one or several threads, leaving other threads capable of performing normally. Thus, while a multithreaded processor may not be able to process multiple threads, it may be able to process fewer or only one thread. The processor still has value which can be retrieved when sold with its reduced capacity but which is lost if the processor is discarded.

There is thus a need in the industry to be able to reduce the number of executable threads in a multithreaded processor while still maintaining the processor's capable to process in a single-threaded mode or in a reduced-thread mode. There is a further need to salvage processors capable of this reduced thread capacity so that the processor can be sold and utilized with its reduced thread capacity and perform either normal single-threaded processing or multi-threaded processing of a reduced number of other thread(s) which don't have defective storage cells.

There is a further need in the industry of multithreaded computers to detect defects in multithreaded registers and/or memory arrays having multithreaded storage elements before the computer is sold to customers. If only those storage elements in a multithreaded memory or register associated with a failed thread becomes unavailable to the processor, the processor itself would not have to be discarded. Thread processing of the thread associated with the defective storage element can be rerouted to storage elements of properly functioning threads.

SUMMARY OF THE INVENTION

These needs and others that will become apparent to one skilled in the art are satisfied by a method to change the thread capacity of a hardware multithreaded computer processing system capable of executing a plurality of threads, the method comprising the steps of performing a test capable of isolating the failure of a register/array uniquely associated with each thread; detecting the failure of at least one register/array and recording the thread with which the failed register/array is uniquely associated; disabling access to all register/arrays associated with the thread having the failed register/array; and maintaining access to all register/arrays uniquely associated with other threads not having a detected failure. The step of performing a test capable of isolating the failure of a register/array uniquely of each thread may further comprise executing coded instructions typical of customer performance requirements under stress to exercise critical sections of the register/array. The test may further comprise a logic built-in self test (LBIST) and/or an array built-in self test (ABIST).

The register/array may comprise a multithreaded register/array having storage cells, each storage cell having one storage element uniquely associated with one thread.

The step of disabling access to all register/arrays associated with the thread having the failed register/array may further comprise blowing a fuse to disconnect the read/write ports to the register/array pertaining to the thread having the failed register/array. In an alternative embodiment, the step of disabling access to all register/arrays associated with the thread with which the at least one failed register/array is uniquely associated may comprise disabling any of a plurality of thread switch control events in a hardware thread switch event control register for the thread. Yet, another embodiment envisions that the step of disabling access to all register/arrays associated with the thread with which the at least one failed register/array is uniquely associated further comprises generating a thread switch instruction by executing microcode instructions.

The invention is also considered a method to change the thread capacity of a hardware multithreaded computer processing system capable of executing a plurality of threads, the method comprising the steps of performing a functional test to isolate the failure of a storage element in a multithreaded register/array, the multithreaded register/array arranged in a matrix of storage cells, each storage cell further comprised of a plurality of storage elements each uniquely corresponding to each of the plurality of threads; detecting the failure of at least one storage element and recording the particular thread with which the at least one failed storage element is uniquely associated; disabling all storage elements uniquely corresponding to the particular thread associated with the at least one failed storage element; and routing data for the particular thread to storage elements uniquely associated with other threads.

The above step of disabling all storage elements associated with the particular thread may further comprise generating a thread switch signal by executing microcode instructions in the multithreaded computer to select others of individual storage elements associated with the other threads.

Alternatively, the above step of disabling all storage elements associated with the particular thread further comprises blowing a fuse. The fuse may be positioned at all read/write ports connected to all storage elements for the particular thread. The fuse may be positioned at a thread switch event control register and disable all or part of the thread switch event control register for the particular thread; or the fuse may be connected to individual bits in the thread switch event control register, the individual bits disabling the particular thread. Yet, the fuse may also be connected to a thread state register pertaining to the particular thread; and more distinctly, the fuse may be further connected to individual bits of the thread state register to mark the particular thread as having an inactive status.

The invention is also considered a multithreaded computer system capable of disabling at least one thread of operation, comprising at least one multithreaded computer processor; at least one thread switch control register for each of a plurality of threads of operation in the multithreaded computer processor; at least one hardware multithreaded memory/register array having multithreaded storage cells in which each storage cell has a storage element uniquely associated with one thread of operation; a main memory connected to the at least one multithreaded computer processor; a bus interface connecting the multithreaded computer processor and the main memory to at least one of the group consisting of: a plurality of data storage devices, one or more external communication networks, one or more input/output devices for providing user input to/from the computer processor. The apparatus further comprises a functional test generator to perform a functional test of at least one thread of operation in the at least one multithreaded computer processor during initial bring-up of the processor; a storage element failure detector which detects the failure of a storage element uniquely associated with the at least one thread of operation undergoing the functional test; and a storage element disabler to disable all the storage elements associated with the at least one thread of operation undergoing the functional test in the multithreaded storage cells.

The invention may further be envisioned as a multithreaded processor, comprising: a means to process a plurality of threads; a means to store the state of each of the plurality of threads in hardware registers in the multithreaded processor; a means to detect if any memory storage elements pertaining to an individual thread are defective; a means to disable access to the defective memory storage elements; a means to maintain access to other memory storage elements that are not defective; and a means to redirect processing and storage of the individual thread pertaining to the defective memory storage element to at least one other thread not having defective memory storage elements.

BRIEF DESCRIPTION OF THE DRAWING

The novel features believed characteristic of the invention are set forth in the claims. The invention itself, however, as well as a preferred mode of use, objects and advantages thereof, will best be understood by reference to the following detailed description of an illustrative embodiment when read in conjunction with the accompanying Drawing, wherein:

DETAILED DESCRIPTION OF THE INVENTION

Figure 1:
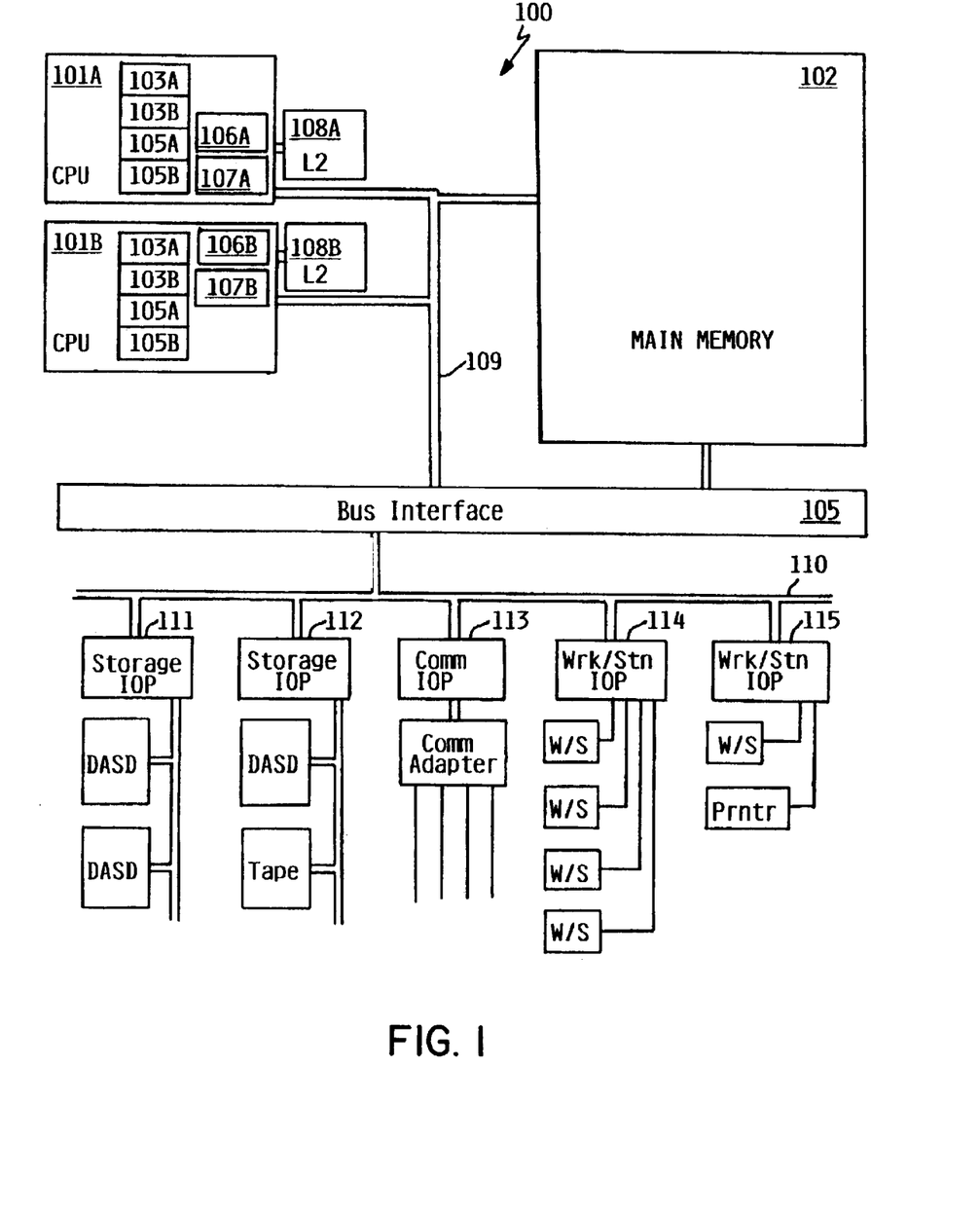
FIG. 1 illustrates the major hardware components of a computer system for utilizing multithreaded registers/memory arrays with storage cells for individual threads according to the preferred embodiment of the present invention.

The major hardware components of a computer system 100 having a register with multithreaded storage cells which can be selectively disabled according to the preferred embodiment of the present invention are shown in FIG. 1. Central processing units (CPUs) 101A and 101B support hardware multithreaded operations in performing basic machine processing on instructions and data from main memory 102. Each CPU 101A and 101B contains respective internal level one instruction caches 106A, 106B (L1 I-cache), and level one data caches 107A, 107B (L1 D-cache). Each L1 I-cache 106A, 106B stores instructions for execution by its CPU. Each L1 D-cache stores data other than instructions to be processed by its CPU. Each CPU 101A, 101B is coupled to a respective level two cache (L2-cache) 108A, 108B which can be used to hold both instructions and data. Memory bus 109 transfers data among CPUs and memory. CPUs 101A, 101B and memory 102 also communicate via memory bus 109 and bus interface 105 with system I/O bus 110. Various I/O processing units (IOPs) 111–115 attach to system I/O bus 110 and support communication with a variety of storage and I/O devices, such as direct access storage devices (DASD), tape drives, workstations, printers, and remote communication lines for communicating with remote devices or other computer systems. For simplicity, CPU, L1 I-cache, L1 D-cache, and L2 cache are herein designated generically by reference numbers 101, 106, 107 and 108, respectively. While various buses are shown in FIG. 1, it should be understood that these are intended to represent various communications paths at a conceptual level, and that the actual physical configuration of buses may vary, and in fact may be considerably more complex. It should further be understood that FIG. 1 is intended as but one example of a system configuration, and that the actual number, type and configuration of components in a computer system may vary. In particular, the present invention could be employed in systems having a single multithreaded CPU, or in systems have multiple multithreaded CPUs.

Each CPU 101 is capable of maintaining the state of multiple threads. CPU 101 will typically include a plurality of general purpose registers for storing data, and various special-purpose registers for storing conditions, intermediate results, instructions, and other information which collectively determine the state of the processor. This information is replicated for each thread supported by CPU 101. Within each CPU 101, there is a thread state register 103A and 103B for each thread which contains information regarding the thread's priority, its active or inactive status, etc. Shown in FIG. 1 are two thread state registers assuming a two-threaded system; however, the processor may be capable of maintaining the state and processing more than two threads. The thread state register generates an active thread signal. Hardware thread switch control registers 105A and 105B that can be programmed to select the events which generate thread switching. Each thread switch control event has a separate enable bit in the thread switch control register 105. There may be a separate thread switch control register for each thread but more frequently the individual bit circuits of the register corresponding to an individual thread would typically be physically interleaved on a chip, i.e., bit 0 of the register portion for thread 0 would be physically adjacent bit 0 of register portions for each of the other threads; the respective bit 1 circuits would all be physically adjacent each other, etc. The thread switch control events for one thread in one thread switch control register need not be identical to the thread switch control events associated with another thread or to the events in any other thread switch control register. The thread switch control register can be written by a service processor as is known in the art. The contents of the thread switch control register is used by a hardware thread switch controller to enable or disable the generation of a thread switch in the multithreaded processor. A value of one in the register enables the thread switch control event associated with that bit to generate a thread switch. A value of zero in the thread switch control register disables the thread switch control event associated with that bit from generating a thread switch. A value of zero in bits 22:29 will disable the thread associated with the bit. Of course, an instruction in the executing thread could disable any or all of the thread switch conditions for that particular thread or for other threads. The following table provides an example of the association between thread switch events and their enable bits in the thread switch control register.

Thread Switch Control Register Bit Assignment (0) Switch on L1 data cache fetch miss
(1) Switch on L1 data cache store miss
(2) Switch on L1 instruction cache miss
(3) Switch on instruction TLB miss
(4) Switch on L2 cache fetch miss
(5) Switch on L2 cache store miss
(6) Switch on L2 instruction cache miss
(7) Switch on data TLB/segment lookaside buffer miss
(8) Switch on L2 cache miss and dormant thread not L2 cache miss
(9) Switch when thread switch time-out value reached
(10) Switch when L2 cache data returned
(11) Switch on IO external accesses
(12) Switch on double-X store: miss on first of two*
(13) Switch on double-X store: miss on second of two*
(14) Switch on store multiple/string: miss on any access
(15) Switch on load multiple/string: miss on any access
(16) Reserved
(17) Switch on double-X load: miss on first of two*
(18) Switch on double-X load: miss on second of two*
(19) Switch on or 1,1,1 instruction if machine state register (problem state) bit, msr(pr)=1. Allows software priority change independent of msr(pr). If bit 19 is one, or 1,1,1 instruction sets low priority. If bit 19 is zero, priority is set to low only if msr(pr)=0 when the or 1,1,1 instruction is executed. See changing priority with software, to be discussed later.
(20) Reserved
(21) Thread switch priority enable
(22:29) Thread Enablement—one bit per thread
(30:31) Forward progress count
(32:63) Reserved in 64 bit register implementation

* A double-X load/store refers to loading or storing an elementary halfword, a word, or a double word, that crosses a doubleword boundary. A double-X load/store in this context is not a load or store of multiple words or a string of words.

Additional background information concerning multithreaded processor design is contained in the following commonly assigned copending U.S. patent applications, herein incorporated by reference in their entireties: Serial No. unknown, filed concurrently herewith entitled Field Protection Against Thread Loss in a Multithreaded Computer Processor; Ser. No. 09/439,581 filed Nov. 12, 1999 entitled Master-Slave Latch Circuit for Multithreaded Processing; Ser. No. 09/266,133 filed Mar. 10, 1999 entitled Instruction Cache for Multithreaded Processor; Ser. No. 08/976,533 filed Nov. 21, 1997 entitled Accessing Data from a Multiple Entry Fully Associative Cache Buffer in a Multithread Data Processing System; Ser. No. 08/966,706 filed Nov. 10, 1997 entitled Effective-To-Real Address Cache Managing Apparatus and Method; Ser. No. 08/958,718 filed Oct. 23, 1997, entitled Altering Thread Priorities in a Multithreaded Processor; Ser. No. 08/958,716 filed Oct. 23, 1997, entitled Method and Apparatus for Selecting Thread Switch Events in a Multithreaded Processor; Ser. No. 08/957,002 filed Oct. 23, 1997 entitled Thread Switch Control in a Multithreaded Processor System; Ser. No. 08/956,875 filed Oct. 23, 1997 entitled An Apparatus and Method to Guarantee Forward Progress in a Multithreaded Processor; Ser. No. 08/956,577 filed Oct. 23, 1997 entitled Method and Apparatus To Force a Thread Switch in a Multithreaded Processor; Ser. No. 08/773,572 filed Dec. 27, 1996 entitled Background Completion of Instruction and Associated Fetch Request in a Multithread Processor. While the multithreaded processor design described in the above applications is a coarse-grained multithreading implementation, it should be understood that the present invention is applicable to either coarse-grained or fine-grained multithreading.

A multithreaded memory register/array contrasts with a conventional two-threaded memory array having a common read data bus. The paradigm of computer architecture having the common read bus assumed that read independence is necessary and requires a separate read decoder for data of each thread to be read simultaneously. It was discovered, however, that a multithreaded memory having an optimized wireability and associated optimally minimized transistor count can be achieved by eliminating read independence without suffering significant negative consequences because the number of instances in which data for two or more threads are simultaneously required is negligible. The multithreaded storage cell of FIG. 2 reflects the discovery that consumption in chip-surface area can be reduced significantly by elimination of read independence without suffering substantial negative consequences because read independence is a negligible functional attribute for a processor that can only access one thread at a time. Fewer transistors are required for the thread selector and the read ports than what would have been necessary to form separate read ports for each of the threads.

Figure 2:
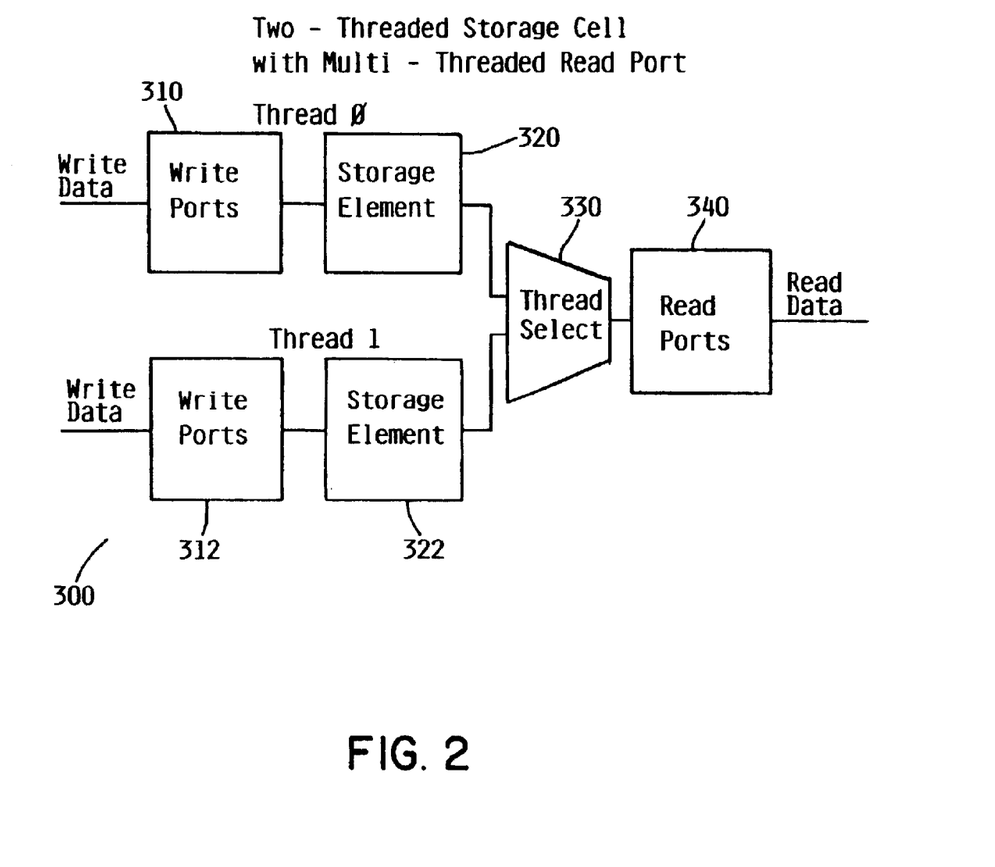
FIG. 2 is a simplified block diagram of a multithreaded storage cell.

FIG. 2 depicts a block diagram of a multithreaded storage cell as in U.S. Pat. No. 5,778,243, commonly owned by the assignee herein and incorporated by reference in its entirely. The multithreaded storage cell 300 has a multithreaded read interface including a thread selector 330 for selectively connecting threads 0 and 1 to the read ports 340. The number of read ports 340 corresponds to the number of functional units, usually more than one, e.g, six to eight functional units, that can be read from storage elements 320 and 322. An example of a functional unit is a arithmetic logic unit that can perform integer, logical shifting, field extraction and/or floating point operations and/or conversions between integer and floating point number representations. For a read operation, each storage element 320, 322 is connected to a functional unit as follows: the storage element 320, 322 is connected to the thread selector 330; the thread selector 330 is connected to one of the read ports 340; this one port is connected to a decoder (not shown in FIG. 2); and the decoder is connected to the functional unit, also not shown in FIG. 2.

FIG. 2 also includes write ports 310 for thread 0 and write ports 312 for thread 1, the number of write ports corresponding in number to the number of functional units, usually more than one, e.g., three or twelve functional units, that can write to the storage element; storage element 320 for thread 0 connected to the write ports 310 and the thread selector 330 and storage element 322 for thread 1 connected to the write ports 312 and thread selector 110.

A processor (not shown) can read the data in the storage element 320 by controlling the thread selector 330 to select thread 0, thereby making the data of storage element 320 available on the read ports 340. Similarly, to read the data in the storage element 322, it is necessary for the processor to control the thread select 330 to select the line from the storage element 322.

Figure 3:
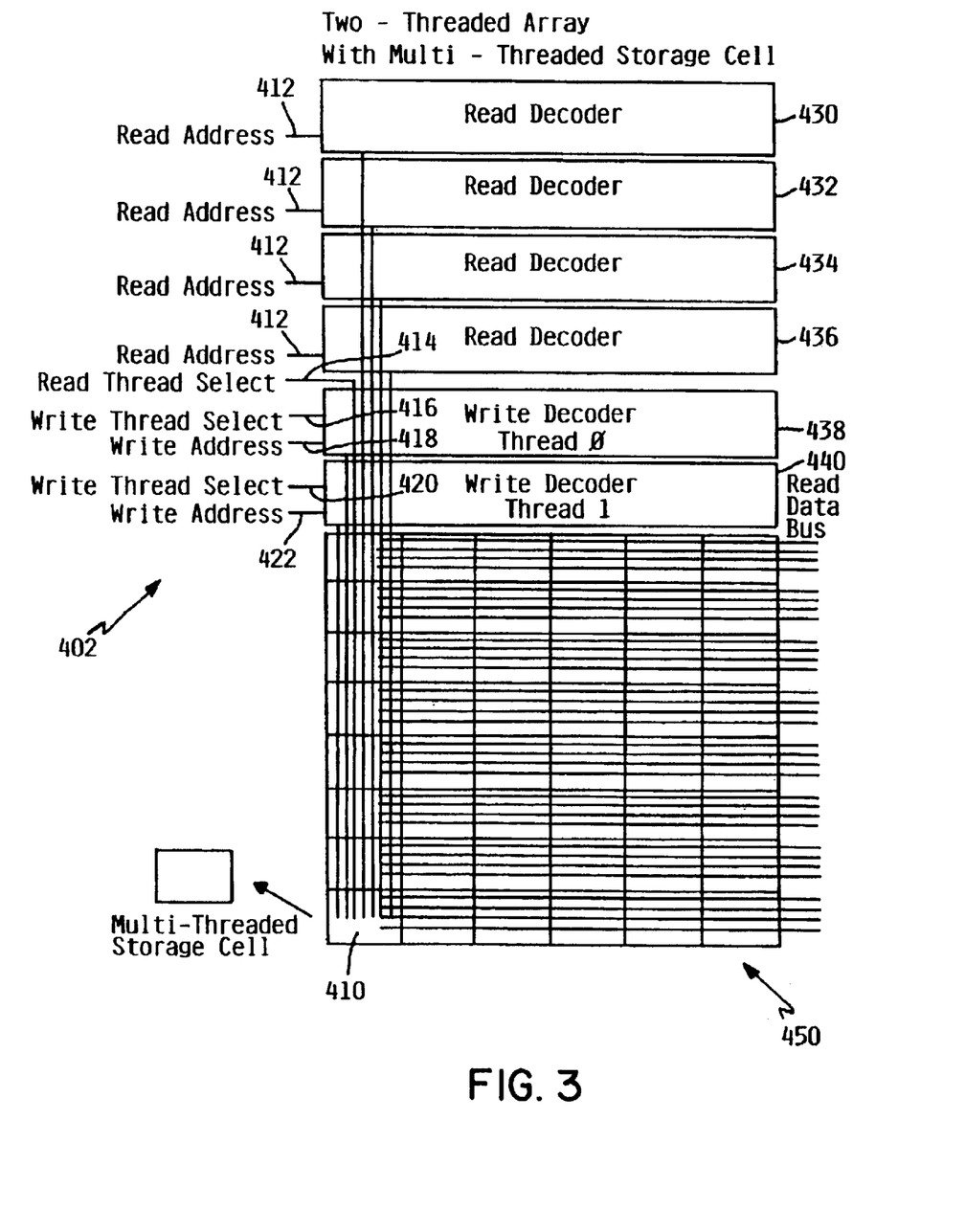
FIG. 3 is a more detailed block diagram of the multithreaded storage cell of FIG. 2.

FIG. 3 depicts a more detailed block diagram of the embodiment of FIG. 2. FIG. 3 shows a two-threaded array 402 formed from multithreaded storage cells 410. The two-threaded array of FIG. 3 includes read decoders 430, 432, 434, 436, a write decoder 438 for thread 0, a write decoder 440 for thread 1, and an array 450 of the multithreaded storage cells 410. Only the wire interconnections for one storage cell 410 are shown because the interconnections for the other cells in the array are the same.

Each of the write decoders 438, 440 is connected to a write address bus 418, 422 and is connected to its own write thread select line 416, 420, respectively. In this fashion, thread selection is made externally to the two-threaded register 402. In contrast, the read decoder, e.g., 430, 432, 434, 436 is connected to the read address bus 412 but not connected to the read thread select line 414. Rather, each of the memory cells 410 is connected to the read thread select line 414 so that the selection of which thread to read takes place within, rather then externally to, the multithreaded storage cell 410.

Figure 4:
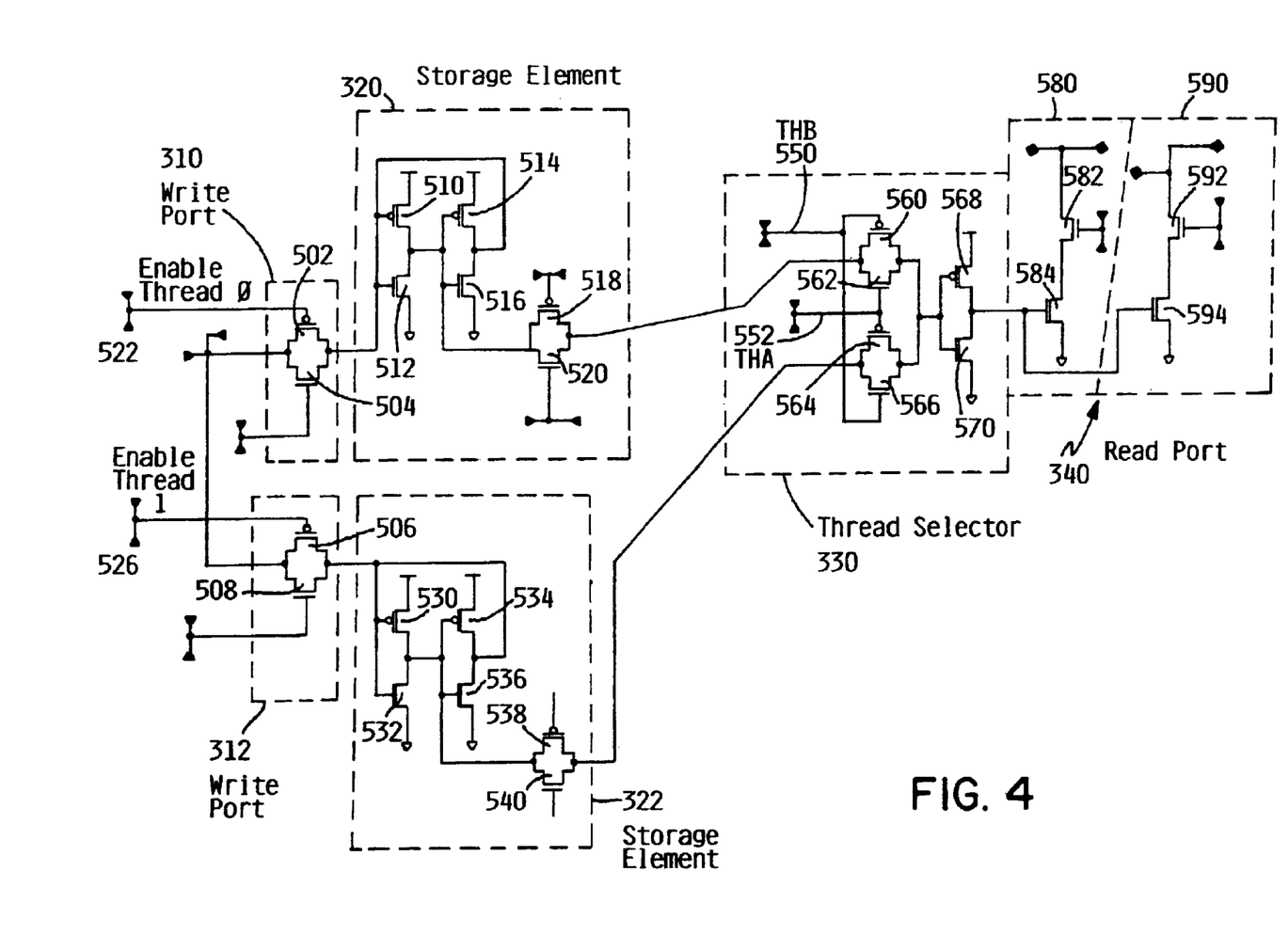
FIG. 4 is a schematic depiction of the multithreaded storage cell of FIG. 3.

FIG. 4 depicts a schematic diagram of the embodiment of FIG. 2. In particular the blocks are shown as having been formed from CMOS transistors, although the invention is application to NMOS, BICMOS, BINMOS, bipolar, SOI, and GaAS, among other technologies. A storage element 320 for a first thread is formed from transistors 510, 512, 514, 516, 518, 520 and holds a single bit. The write port 310 of the first thread is shown as only having a single port because of a simplifying assumption of only one functional unit writing to the storage element though as stated above there could be more than one such functional unit. The write port 310 is formed from transistors 502, 504 and is enabled by a thread enable signal 522 across the gate of transistor 502. The second thread has a storage element 322 formed from transistors 530, 532, 534, 536, 538, 540 and a write port 312 comprising transistors 506 and 508. A second thread enable signal 526 is connected to the gate of transistor 506. The thread selector 330 is formed from the transistors 560, 562, 564, 566, 568, 570. Based upon the state of the signal THB on line 550 connected to the gate of transistor 560 and the gate of transistor 566 and the signal THA on line 552 connected to the gate of transistor 562 and the gate of transistor 564, the thread selector 330 selects either the first or second thread. The read port(s) 340 includes two ports 580 and 590, the first port 580 being formed from the transistors 582 and 584 and the second port 590 being formed from the transistors 592 and 594. Again, the number of ports at each interface is exemplary and in practice will vary according to the number of functional units that can write/read to/from a storage element.

After manufacture, the registers and memory arrays having the multithreaded storage cells are tested. There are several test procedures of which LBIST and ABIST are only two tests in which a known bit sequence is input into the array and compared with the output of the array. In a properly functional memory array, the input matches the output. These sequences can be performed at high speeds and can involve many memory cells simultaneously to "stress" the processor to determine its failure parameters, if any. Another kind of test is a functional test in which actual coded instructions typical of customer performance requirements are executed under stress to exercise critical sections of the memory arrays. Again, these tests can be performed at different processor speeds to determine if and when the processor may fail. Such failures are most commonly the result of memory arrays and general and specialized registers unable to capture and hold a bit value in the multithreaded storage cell. An important feature of the invention is the ability to test the values stored in individual storage cells associated with separate threads. In other words, in the context of the invention, each thread can now be tested separately.

Figure 5:
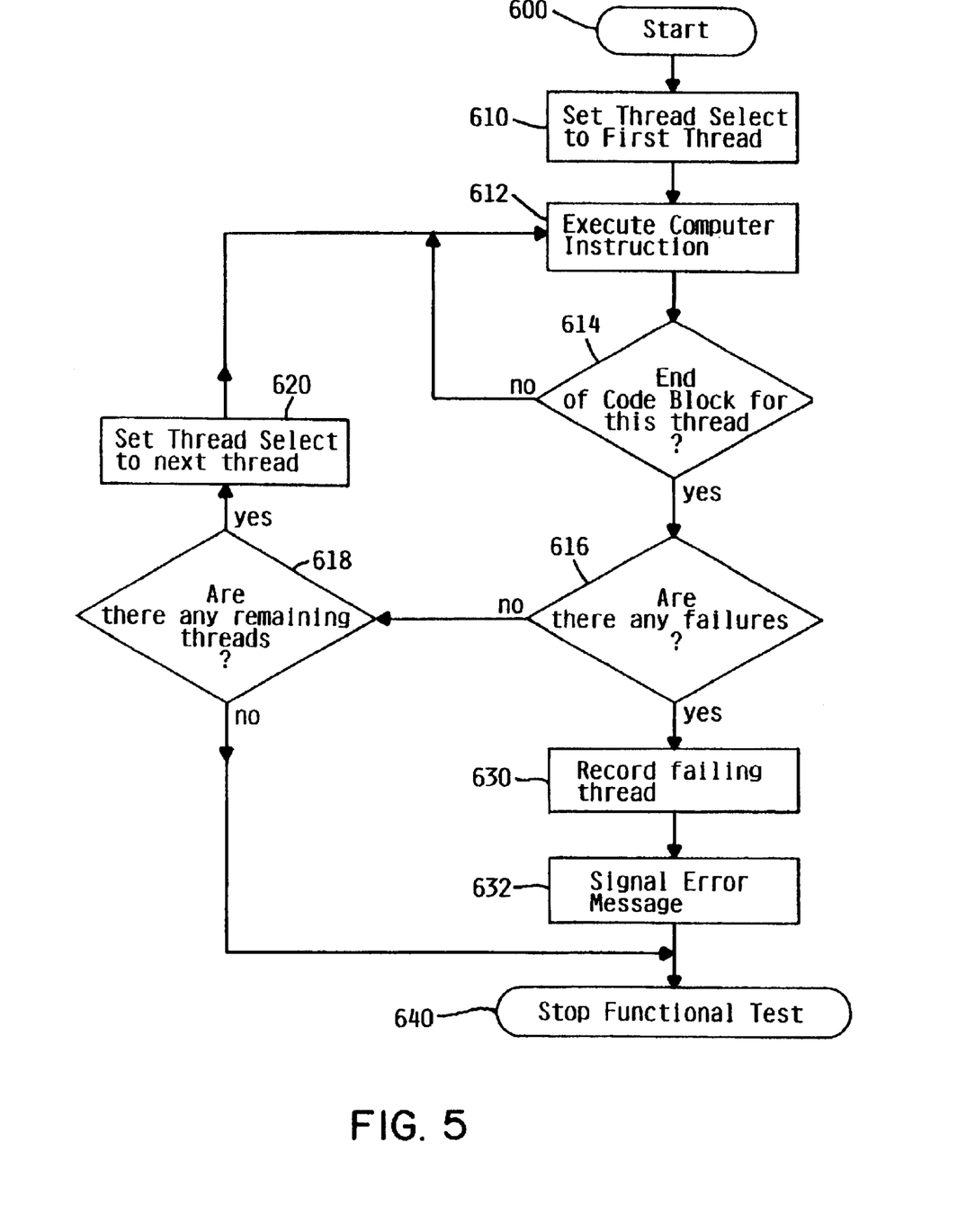
FIG. 5 is a simplified flow chart of the process by which to detect that a storage element of a multithreaded cell is defective.

FIG. 5 is a simplified flow chart of a method by which to detect failures of a multithreaded processor. Although FIG. 5 illustrates a functional test which executes actual coded instructions until a failure occurs, if at all, other tests, e.g., ABIST, LBIST, etc., intended to test memory arrays can also be used in the context of the invention. Typically these tests are performed after manufacturing and/or periodically during the normal operation of the processor system in the field, i.e., at the customer's location during normal processor performance. In the preferred embodiment set forth herein, these tests are performed during initial bring-up, i.e., the processor chip has been manufactured but has not been assembled into a computer nor has it been sold. From start at step 600, the process proceeds to step 610 where the active thread is set to the first thread. This can be accomplished by the thread state register in the CPU. Next in step 612, an instruction of the active thread is executed in the processor. At step 614, the test procedure checks to see if there are further instructions of the active thread to be executed. If there are further instructions, then the process loops back to step 612 to execute the next instruction for that thread. If, however, at step 614, there are no further instructions for the selected thread, then at step 616, the process inquires if there are any failures during the execution of the instructions for the selected thread.

If there are no register or memory array failures in step 616, the process checks to see if there are additional threads to test, as in step 618. If so, as in step 620, the thread select is programmed to select another thread for testing the execution of its instructions, as in step 612 again. If, however, the first thread experienced a failure, the failure is recorded in step 630 and a signal error message is generated at step 632. At this time, the test may be terminated at step 640 because the processor has experienced a functional failure in a multithreaded register or memory array. Alternatively, the test continues to the next thread as the active selected thread until all the threads have been tested. Prior to the inventive features disclosed herein, the processor chip experiencing the failure would be discarded even though other threads within the processor could execute properly and the storage cells for other threads may be fully functional because not all the threads were tested.

In this fashion, the flow chart of FIG. 5 represents several inventive features resulting in the advantage of salvaging the processor by ascertaining which particular thread is dysfunctional. The processor having the multithreaded registers need not be discarded. Instead, those defective storage elements may be disabled and the instructions and data for the thread experiencing failures in the multithreaded memory array may be rerouted to storage elements of the other threads in the same or different array or register.

Figure 6:
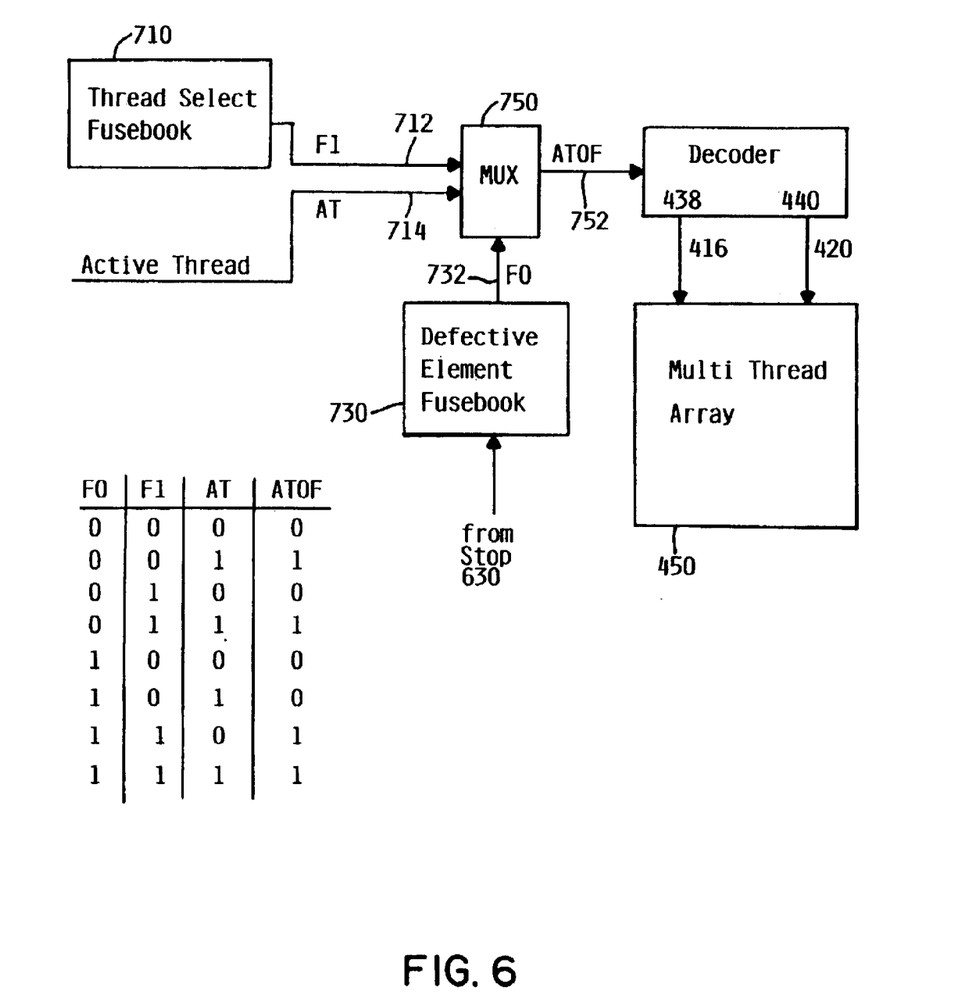
FIG. 6 is a simplified block diagram of the components of a multithreaded memory register/array having the capability to change its thread capacity in accordance with one embodiment of the invention. It is suggested that FIG. 6 be printed on the face of the patent.

One embodiment of a hardware apparatus and method to disable defective storage elements associated with only one thread in a two-threaded register/array is shown in FIG. 6. The multithreaded register/array 450 is shown as having two threads but the concepts and the hardware can easily be extended by one skilled in the art to more than two threads. The modification in accordance with the preferred embodiment of the invention includes a plurality of fusebooks and a multiplexer in conjunction with hardwired logic. Fuses within the fusebooks can be set to drive a digital signal of "1" or "0" and typically these values cannot be changed once they are set.

Referring to FIG. 6, a first fusebook 710 called the thread select fusebook generates an output signal F1 712 into a multiplexer 750. Also input to the multiplexer 750 is the active thread signal AT 714 generated by the thread state registers. A third signal F0 732 input to the multiplexer 750 derives from a second fusebook 730, called the defective element fusebook. This defective element fusebook outputs a signal F0 732 having a value of "1" if any defective storage element was detected during a functional test, e.g., from step 630 of FIG. 5. The thread select fusebook 710 outputs a signal F1 712 having a value corresponding to the thread whose storage elements are NOT defective and also receives this knowledge from the results of the functional or other tests performed during a bring-up or at other times before selling the processor. The active thread signal AT 714 simply indicates the active thread being processed and wanted to access a register/array which may be the register/array 450 of multithreaded storage cells. In accordance with one example of the logic for a two-threaded memory array which can be embodied in the multiplexer, an output signal AT oF 752 (for Active Thread or Fuse) to the decoder of a write or a read port indicates which thread to access in the multi-threaded array. The output signal could also be output to either individual bits of a register or to the entire array, for instance, the fusebooks 710 and 730 and the multiplexer 750 arranged as in FIG. 6 could be connected to individual bits of bits 22:29 of the thread switch control event register or to the thread switch control event register for a particular thread. Similarly, the fusebook arrangement of FIG. 6 could also be connected to the ports of each thread's state register or to individual bits of the thread state register, e.g., to mark the state of a thread as always being inactive. The result would be therefore to disable the thread at the register. If a defective array or a defective storage element in a multithreaded register/array were detected, signal F0 would be set to 1. If the thread having the properly functioning storage elements was the first thread, the signal F1 would be 0. Now if the active thread is Thread 0, also a value of 0 in the logic chart, the output signal AT oF would be 0 and the memory cell could be accessed. If, however, the above conditions remain the same except that the active thread signal was for Thread 1, the signal F1 and the signal AT would be inconsistent and access to the storage element for the second thread would be disabled. Thus, under the logic given, whenever a defective storage element had been detected so the F0 signal is 1 and the active thread signal AT is inconsistent with signal F1 indicating which thread has properly functioning storage elements, access to the register/array requested by the active thread is disabled.

Figure 7:
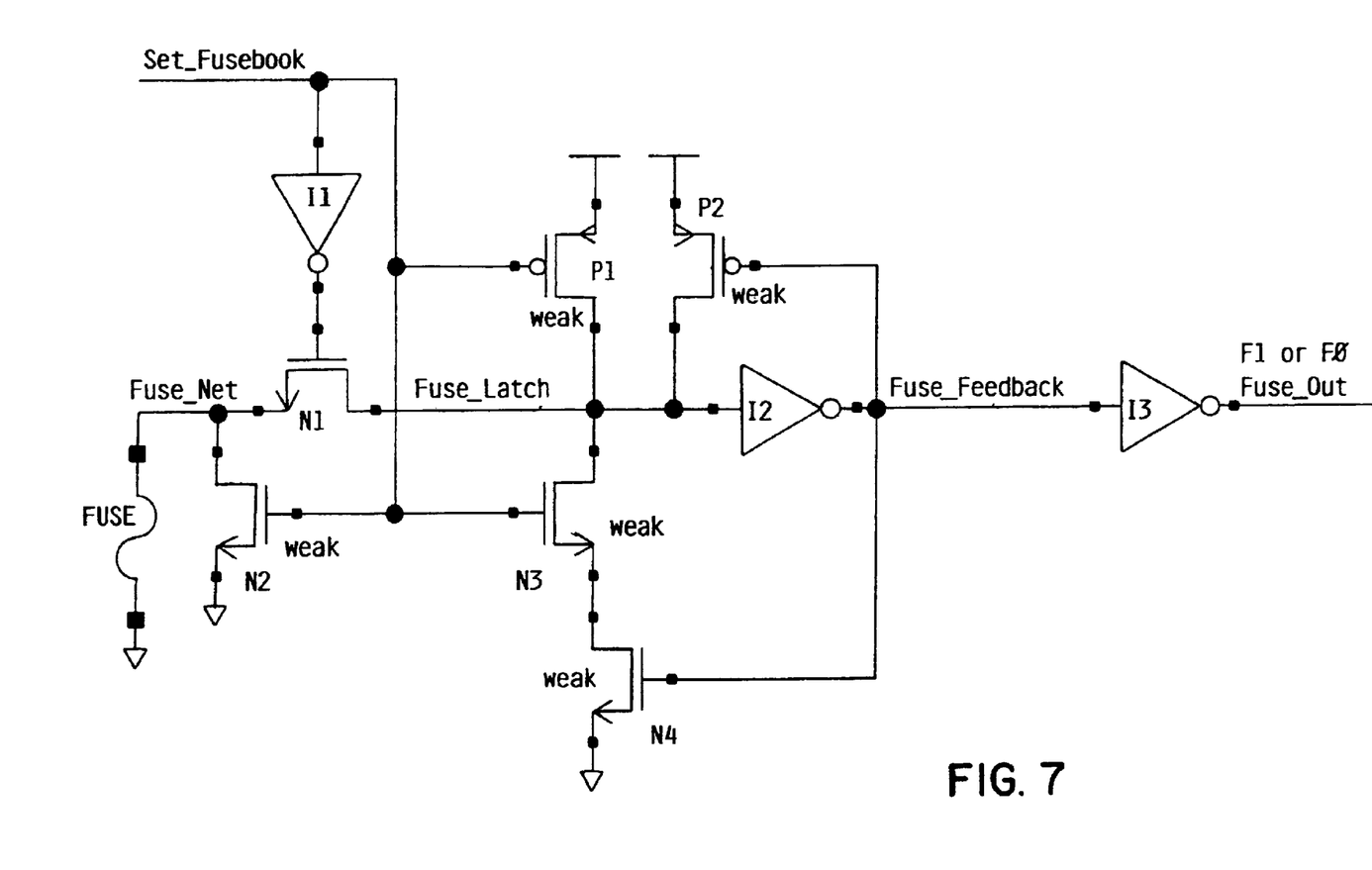
FIG. 7 is a circuit diagram of a fusebook that can be used in accordance with the multithreaded memory register/array to change the thread capacity of the register/array.

FIG. 7 is only one example of a fusebook which could be incorporated into the hardware of a multithreaded register/array. Fuses actually have numerous implementations and one skilled in the art will be aware of other fuses and/or hard-wired logic which can equivalently implemented. The net Set_Fusebook is activated on startup and defaults to an output value of "1" but drops to a value of "0" to set the fusebook. The net Set_Fusebook then returns to a value of "1" for the duration of the processor's lifetime. In setting the fusebook, Set_Fusebook drops to 0 which turns on transistors N1 and P1 and turns off transistors N3 and N2. If the fuse has not been blown, Fuse_Net is set to 0. When N1 is on, Fuse_Latch shorts Fuse_Net which goes to 0 causing Fuse_Feedback to go to a value of 1 through inverter 12. This action in turns shuts off P2, turns on N4 and the output signal Fuse_Out goes to 0 through inverter 13. When Set_Fusebook goes high, transistors N3 and N2 are activated but transistors N1 and P1 are deactivated. There is now a feedback path through N3 and N4 holding Fuse_Latch at 0, Fuse_Feedback at 1, and Fuse_Out at 0. This will remain until the chip is powered down as Set_Fusebook stays at a 1 except for startup.

If, however, the fuse has been blown which can be accomplished using a laser or electrically, Fuse_Net has no path to ground except when transistor N2 is on, i.e., when Set_Fusebook is 1. So, when Set_Fusebook goes to 0, Fuse_Net is floating at a 0 state and transistors N1 and P1 come on. P1 will overcome the ground value of Fuse_Net through transistor N1 and bring Fuse_Feedback to 0, Fuse_Latch and Fuse_Net to 1. There is no feedback path through transistor P2 such that when Set_Fusebook returns to 1 and transistors P1 and N1 deactivate, the value of Fuse_Latch will be held at 1, Fuse_Feedback will be held at 0 with transistor N4 off, and Fuse-Out will remain at 1.

While various embodiments of the present invention have been described above, it should be understood that they have been presented by way of example and not limitation and that variations are possible. The invention is not limited to coarse-grained multithreading which switches threads upon a latency event; it can be equivalently modified to be included in fine-grained multithreading systems. The invention, moreover, is not limited to those hardware multithreaded processors having only two threads but can be extended to processors capable of execution of multiple threads. Although the preferred embodiment of the invention has been described with respect to multithreaded memory registers having unique storage elements per thread in each of the storage cells, the inventive feature of changing the thread capacity of a multithreaded processor is equivalently applicable to multithreaded processors having separate registers for each thread. Hardware techniques, other than fusebooks, which disable registers can also be implemented. The logic required for the disabling of a port to the register/array may also be different. Thus, the breadth and scope of the present invention should not be limited by any of the above-described exemplary embodiments, but should be defined only in accordance with the following claims and their equivalents.

What is claimed is:

1. A method to change the thread capacity of a hardware multithreaded computer processing system capable of executing a plurality of threads, said method comprising the steps of:
   (a) performing a test capable of isolating a failure of a register/array having a plurality of storage elements accessible by only one of said plurality of threads;
   (b) detecting the failure of the at least one register/array and recording the thread associated with the storage elements of the at least one failed register/array;
   (c) disabling access to the plurality of storage elements accessible by the only one of said plurality of threads in all register/arrays having data of the only one of said plurality of threads associated with the at least one failed register/array; and
   (d) maintaining access to all storage elements in the failed and other registers/arrays accessible by other of said plurality of threads not having a detected failure.

2. The method of claim 1 wherein said step of performing a test capable of isolating the failure of a register/array having a plurality of storage elements accessible by only one of said plurality of threads further comprises executing coded instructions typical of customer performance tin requirements under stress to exercise critical sections of the register/array.

3. The method of claim 1 wherein said step of performing a test capable of isolating the failure of a register/array having a plurality of storage elements accessible by only one of said plurality of threads further comprises executing a logic built-in self test (LBIST) and/or an array built-in self test (ABIST).

4. The method of claim 1, wherein said register/array further comprises a multithreaded register/array having storage cells, each storage cell having one or more storage elements, said number of storage elements corresponding to the number of threads in the multithreaded register/array, and one of each of said storage elements storing data uniquely associated with one of said plurality of threads.

5. The method of claim 1, wherein said step of disabling access to the plurality of storage elements accessible by the only one of said plurality of threads in all register/arrays uniquely associated with the at least one failed register/array further comprises blowing a fuse to disconnect any of at least one port to said register/array.

6. The method of claim 1, wherein said step of disabling access to the plurality of storage elements accessible by the only one of said plurality of threads in all register/arrays associated with the thread having the at least one failed register/array further comprises executing microcode instructions.

7. A method to change the thread capacity of a hardware multithreaded computer processing system capable of executing a plurality of threads, said method comprising the steps of:
   (a) performing a test capable of isolating the failure of a register/array uniquely associated with each of said plurality of threads;
   (b) detecting the failure of at least one register/array and recording the thread with which the at least one failed register/array is uniquely associated;
   (c) disabling access to all register/arrays having storage elements accessible by the thread with which the at least one failed register/array is associated by disabling any of a plurality of thread switch control events in a hardware thread switch control register for the thread; and
   (d) maintaining access to all storage elements in other register/arrays storing data of other of said plurality of threads not have a detected failure.

8. A method to change the thread capacity of a hardware multithreaded computer processing system capable of executing a plurality of threads, said method comprising the steps of:
   (a) performing a functional test to isolate the failure of a storage element in a multithreaded register/array, the multithreaded register/array arranged in a matrix of storage cells, each storage cell further comprised of a plurality of storage elements, one of each of said storage elements in each storage cell being accessible by only one of each of the plurality of threads;
   (b) detecting the failure of at least one storage element and recording the particular thread uniquely associated with the at least one failed storage element;
   (c) disabling all storage elements accessible by only the particular thread uniquely associated with the at least one failed storage element; and
   (d) routing data for the particular thread to storage elements accessible by other of said plurality of threads.

9. The method of claim 8, wherein said step of disabling all storage elements that are accessible by only said particular thread further comprises blowing a fuse.

10. The method of claim 9, wherein said fuse is positioned at a thread switch event control register and disables all or part of the thread switch event control register for the particular thread.

11. The method of claim 10, wherein said fuse is connected to individual bit in a thread switch event control register, the individual bits disabling the particular thread.

12. The method of claim 9, wherein said fuse is connected to a thread state register pertaining to said particular thread.

13. The method of claim 12, wherein said fuse is further connected to individual bits of the thread state register to mark the particular thread as having an inactive status.

14. A method to change the thread capacity of a hardware multithreaded computer processing system capable of executing a plurality of threads, said method comprising the steps of:
   (a) performing a functional test to isolate the failure of a storage element in a multithreaded register/array, the multithreaded register/array arranged in a matrix of storage cells, each storage cell further comprised of a plurality of storage elements each uniquely corresponding to each of the plurality of threads;
   (b) detecting the failure of at least one storage element and recording the particular thread with which the at least one failed storage element is uniquely associated;

(c) disabling all storage elements uniquely corresponding to the particular thread associated with the at least one failed storage element by generating a thread switch signal by executing microcode instructions in the multithreaded computer to select others of individual storage elements associated with other of said plurality of threads; and (d) routing data for the particular thread to storage elements uniquely associated with other of said plurality of threads.

15. A method to change the thread capacity of a hardware multithreaded computer processing system capable of executing a plurality of threads, said method comprising the steps of:

(a) performing a functional test to isolate the failure of a storage element in a multithreaded register/array, the multithreaded register/array arranged in a matrix of storage cells, each storage cell further comprised of a plurality of storage elements each uniquely corresponding to each of the plurality of threads;

(b) detecting the failure of at least one storage element and recording the particular thread with which the at least one failed storage element is uniquely associated;

(c) disabling all storage elements uniquely corresponding to the particular thread associated with the at least one failed storage element by blowing a fuse positioned at all read/write ports connected to all storage elements associated with said fuse; and (d) routing data for the particular thread to storage elements uniquely associated with other of said plurality of threads.

16. A multithreaded computer system capable of disabling at least one thread of operation, comprising:

(a) at least one multithreaded computer processor;

(b) at least one thread switch control register for each of a plurality of threads of operation in said multithreaded computer processor;

(c) at least one hardware multithreaded memory/register array having multithreaded storage cells in which each of said storage cells has a storage element uniquely associated with one thread of operation;

(d) a main memory connected to the at least one multithreaded computer processor;

(e) a bus interface connecting the multithreaded computer processor and the main memory to at least one of the group consisting of: a plurality of data storage devices, one or more external communication networks, one or more input/output devices for providing user input to/from the computer processor;

(f) a functional test generator to perform a functional test of at least one thread of operation in the at least one multithreaded computer processor during initial bring-up of the processor;

(g) a storage element failure detector which detects the failure of a storage element uniquely associated with the at least one thread of operation undergoing the functional test; and (h) a storage element disabler to disable all the storage elements associated with the at least one thread of operation undergoing the functional test in the multithreaded storage cells.

* * * * *

UNITED STATES PATENT AND TRADEMARK OFFICE
CERTIFICATE OF CORRECTION

PATENT NO.   : 6,748,556 B1
DATED        : June 8, 2004
INVENTOR(S)  : Salvatore N. Storino and Gregory J. Uhlman It is certified that error appears in the above-identified patent and that said Letters Patent is hereby corrected as shown below:

<u>Columns 11-14,</u>
Please amend the claims as follows:

1. (Amended Twice) A method to change the thread capacity of a hardware multithreaded computer processing system capable of executing a plurality of threads, said method comprising the steps of:
   (a)  performing a test capable of isolating a failure of a storage element in a register/array having a plurality of storage elements, the storage element being allocated to only one of said plurality of threads;
   (b)  detecting the failure of the storage element and recording the thread allocated to the failed storage element
   (c)  disabling access to the failed storage element and a first plurality of other storage elements allocated to the thread allocated to the failed storage element in the register/array; and
   (d)  maintaining access to a second plurality of storage elements allocated to other of said plurality of threads not allocated to the failed storage element.

2. (Amended Twice). The method of claim 1 wherein said step of performing a test capable of isolating the failure of the storage element in the register/array further comprises executing coded instructions typical of customer performance requirements under stress to exercise critical sections of the register/array.

3. (Amended Twice) The method of claim 1 wherein said step of performing a test capable of isolating the failure of the storage element in the register/array further comprises executing a logic built-in self test (LBIST) and/or an array built-in self test (ABIST).

4. (Previously Amended) The method of claim 1, wherein said register/array further comprises a multithreaded register/array having storage cells, each storage cell having one or more storage elements, said number of storage elements corresponding to the number of threads in the multithreaded register/array, and one of each of said storage elements storing data uniquely associated with one of said plurality of threads.

UNITED STATES PATENT AND TRADEMARK OFFICE
CERTIFICATE OF CORRECTION

PATENT NO.    : 6,748,556 B1
DATED         : June 8, 2004
INVENTOR(S)   : Salvatore N. Storino and Gregory J. Uhlman It is certified that error appears in the above-identified patent and that said Letters Patent is hereby corrected as shown below:

5. (Amended Twice) The method of claim 1, wherein said step of disabling access to the failed storage element and a first plurality of other storage elements allocated to the thread allocated to the failed storage element further comprises blowing a fuse to disconnect any of at least one port to said register/array.

6. (Previously Amended - Indicated Allowable) A method to change the thread capacity of a hardware multithreaded computer processing system capable of executing a plurality of threads, said method comprising the steps of:
   (a) performing a test capable of isolating the failure of a register/array uniquely associated with each of said plurality of threads;
   (b) detecting the failure of at least one register/array and recording the thread with which the at least one failed register/array is uniquely associated;
   (c) disabling access to all register/arrays having storage elements accessible by the thread with which the at least one failed register/array is associated by disabling any of a plurality of thread switch control events in a hardware thread switch control register for the thread; and
   (d) maintaining access to all storage elements in other register/arrays storing data of other of said plurality of threads not have a detected failure 7. (Amended Twice) The method of claim 1, wherein said step of disabling access to the failed storage element and the first plurality of other storage elements in the register/array allocated to the thread allocated to the failed storage element further comprises executing microcode instructions.

8. (Amended Twice) A method to change the thread capacity of a hardware multithreaded computer processing system capable of executing a plurality of threads, said method comprising the steps of:
   (a) performing a functional test to isolate the failure of a storage element in a multithreaded register/array, the multithreaded register/array arranged in a matrix of storage cells, each storage cell further comprised of a plurality of storage elements, one of each of said storage elements in each storage cell allocated to one of each of the plurality of threads;
   (b) detecting the failure of at least one storage element and recording the particular thread allocated to the at least one failed storage element;
   (c) disablling all storage elements allocated to the particular thread allocated to the at least one failed storage element; and

UNITED STATES PATENT AND TRADEMARK OFFICE
CERTIFICATE OF CORRECTION

| | | |
|---|---|---|
| PATENT NO. | : 6,748,556 B1 | Page 3 of 5 |
| DATED | : June 8, 2004 | |
| INVENTOR(S) | : Salvatore N. Storino and Gregory J. Uhlmann | |

It is certified that error appears in the above-identified patent and that said Letters Patent is hereby corrected as shown below:

(d)    routing data for the particular thread allocated to the at least one failed storage elements to other storage elements allocated to other of said plurality of threads.

9.    (Previously Amended - Indicated Allowable) A method to change the thread capacity of a hardware multithreaded computer processing system capable of executing a plurality of threads, said method comprising the steps of:
    (a)    performing a functional test to isolate the failure of a storage element in a multithreaded register/array, the multithreaded register/array arranged in a matrix of storage cells, each storage cell further comprised of a plurality of storage elements each uniquely corresponding to each of the plurality of threads;

(b)    detecting the failure of at least one storage element and recording the particular thread with which the at least one failed storage element is uniquely associated;

(c)    disabling all storage elements uniquely corresponding to the particular thread associated with the at least one failed storage element by generating a thread switch signal by executing microcode instructions in the multithreaded computer to select others of individual storage elements associated with other of said plurality of threads; and     (d)    routing data for the particular thread to storage elements uniquely associated with other of said plurality of threads.

10.    (Amended Twice) The method of claim 8, wherein said step of disabling all storage elements allocated to the particular thread allocated to the at least one failed storage element further comprises blowing a fuse.

11.    (Previously Amended - Indicated Allowable) A method to change the thread capacity of a hardware multithreaded computer processing system capable of executing a plurality of threads, said method comprising the steps of:
    (a)    performing a functional test to isolate the failure of a storage element in a multithreaded register/array, the multithreaded register/array arranged in a matrix of storage cells, each storage cell further comprised of a plurality of storage elements each uniquely corresponding to each of the plurality of threads;

(b)    detecting the failure of at least one storage element and recording the particular thread with which the at least one failed storage element is uniquely associated;

UNITED STATES PATENT AND TRADEMARK OFFICE
CERTIFICATE OF CORRECTION

| | | |
|---|---|---|
| PATENT NO. | : 6,748,556 B1 | Page 4 of 5 |
| DATED | : June 8, 2004 | |
| INVENTOR(S) | : Salvatore N. Storino and Gregory J. Uhlmann | |

It is certified that error appears in the above-identified patent and that said Letters Patent is hereby corrected as shown below:

(c)    disabling all storage elements uniquely corresponding to the particular thread associated with the at least one failed storage element by blowing a fuse; positioned at all read/write ports connected to all storage elements associated with said fuse; and     (d)    routing data for the particular thread to storage elements uniquely associated with other of said plurality of threads.

12. (Original - Indicated Allowable) The method of claim 10, wherein said fuse is positioned at a thread switch event control register and disables all or part of the thread switch event control register for the particular thread.

13. (Original - Indicated Allowable) The method of claim 12, wherein said fuse is connected to individual bit in a thread switch event control register, the individual bits disabling the particular thread.

14. (Original - Indicated Allowable) The method of claim 10, wherein said fuse is connected to a thread state register pertaining to said particular thread.

15. (Original - Indicated Allowable) The method of claim 14, wherein said fuse is further connected to individual bits of the thread state register to mark the particular thread as having an inactive status.

16. (Amended) A multithreaded computer system capable of disabling at least one thread of operation, comprising:
    (a)    at least one multithreaded computer processor;
    (b)    at least one thread switch control register for each of a plurality of threads of operation in said multithreaded computer processor;
    (c)    at least one hardware multithreaded memory/register array having multithreaded storage cells in which each of said storage cells has a storage element allocated to one thread of operation;
    (d)    a main memory connected to the at least one multithreaded computer processor;
    (e)    a bus interface connecting the multithreaded computer processor and the main memory to at least one of the group consisting of: a plurality of data storage devices, one or more external communication networks, one or more input/output devices for providing user input to/from the computer processor;

UNITED STATES PATENT AND TRADEMARK OFFICE
CERTIFICATE OF CORRECTION

PATENT NO. : 6,748,556 B1
DATED : June 8, 2004
INVENTOR(S) : Salvatore N. Storino and Gregory J. Uhlmann It is certified that error appears in the above-identified patent and that said Letters Patent is hereby corrected as shown below:

(f)    a functional test generator to perform a functional test of at least one thread of operation in the at least one multithreaded computer processor during initial bring-up of the processor;
    (g)    a storage element failure detector which detects the failure of a storage element allocated to the at least one thread of operation undergoing the functional test; and     (h)    a storage element disabler to disable all the storage elements in the multithreaded storage cells allocated to the at least one thread of operation undergoing the functional test 17. (Amended) A multithreaded processor, comprising:
    (a)    means to process a plurality of threads;
    (b)    means to store the state of each of said plurality of threads in hardware registers in said multithreaded processor;
    (c)    means to detect if any memory storage elements pertaining to one of said plurality of threads are defective;
    (d)    means to disable access to said defective memory storage elements;
    (e)    means to maintain access to other memory storage elements that are not defective; and
    (f)    means to redirect processing and storage of the one of said plurality of threads pertaining to the defective memory storage element to at least one other of said plurality of threads not having defective memory storage elements.

Signed and Sealed this

Ninth Day of November, 2004

JON W. DUDAS
*Director of the United States Patent and Trademark Office*